(12) United States Patent
Cowley

(10) Patent No.: US 6,567,488 B1
(45) Date of Patent: May 20, 2003

(54) RELATING TO DEMODULATOR ALIGNMENT CORRECTION IN TUNERS

(75) Inventor: Nicholas P. Cowley, Wroughton (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 09/454,642

(22) Filed: Dec. 6, 1999

(30) Foreign Application Priority Data

Dec. 9, 1998 (GB) .............................................. 9826934

(51) Int. Cl.[7] .................................................. H04L 7/04
(52) U.S. Cl. ........................ 375/362; 375/316; 375/344
(58) Field of Search ................................. 375/316, 344, 375/354, 362, 364; 455/160.1, 161.1, 161.2, 164.2, 165.1, 183.1, 183.2, 192.3, 195.1

(56) References Cited

U.S. PATENT DOCUMENTS

| 4,232,398 A | * | 11/1980 | Gould et al. ............. 455/226.3 |
| 4,527,188 A | * | 7/1985 | Lewis, Jr. .................... 348/639 |
| 4,847,876 A | * | 7/1989 | Baumbach et al. ......... 329/310 |
| 5,841,482 A | * | 11/1998 | Wang et al. ................ 327/152 |

* cited by examiner

*Primary Examiner*—Don N. Vo
(74) *Attorney, Agent, or Firm*—Kirschstein, etal.

(57) ABSTRACT

A tuner demodulator alignment system adjusts the centre-frequency of the PLL-demodulator VCO to achieve alignment with the center-frequency of the IF entering the demodulator by: injecting into the PLL stage a signal having a frequency equal to the nominal center-frequency of the IF, electronically adjusting, e.g. by means of a digital-to-analogue converter (DAC) controlled from a tuner microcontroller, the VCO frequency until this frequency is aligned with the injection frequency, then removing the injection signal and reverting to normal tuner operation. Alignment with the injection frequency may be signalled by a change in logical stage of an AFC flag signal provided by the PLL stage and employed during normal use of the tuner. This may be repeated on an ad-hoc basis, e.g. whenever channels are changed by the user, or more periodically by the tuner software, or may be performed on a one-off basis only on the production bench.

14 Claims, 3 Drawing Sheets

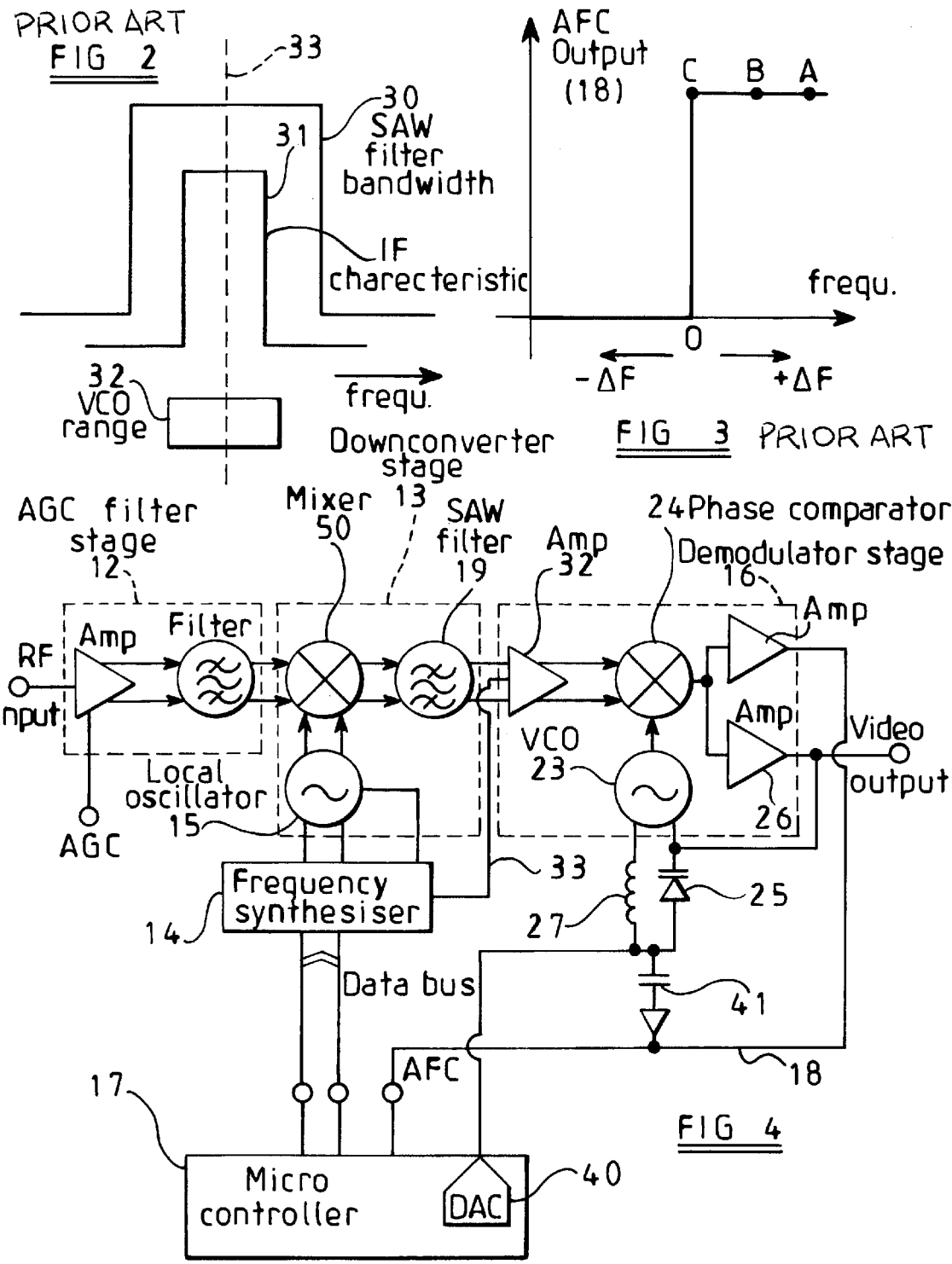

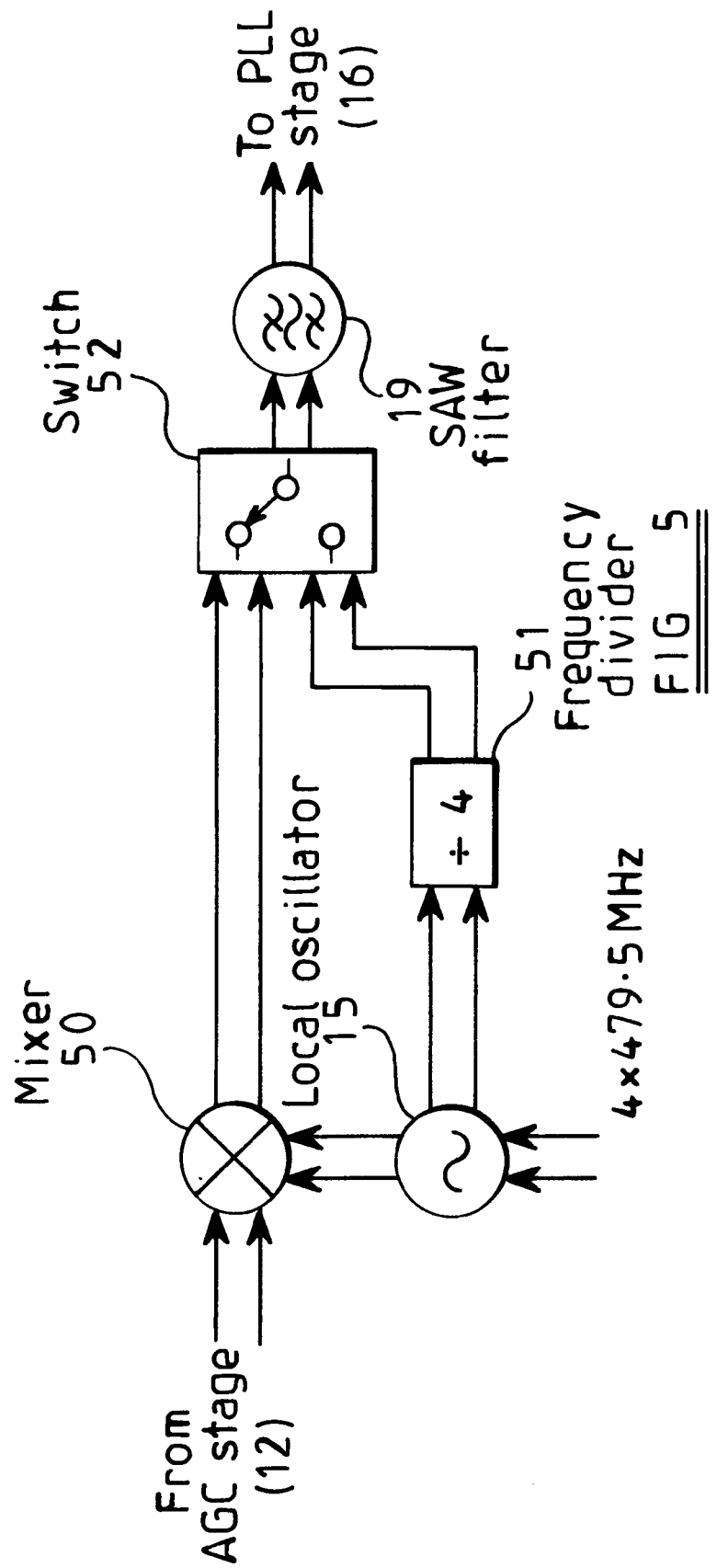

RELATING TO DEMODULATOR ALIGNMENT CORRECTION IN TUNERS

BACKGROUND OF THE INVENTION

1. Field of the Invention

The invention relates to a tuner and to a method for correcting the alignment of a phase-locked-loop demodulating stage in a tuner.

2. Description of the Prior Art

A known form of tuner for use within an analogue TV satellite receiver is illustrated in FIG. 1 of the accompanying drawings as reference designator 10 and comprises an AGC (automatic gain control) filter stage 12, a downconverter and SAW-filter stage 13 fed from the AGC filter stage, a frequency synthesiser stage 14 connected so as to control the frequency of the local oscillator 15 in the downconverter stage, and a PLL (phase-locked loop) FM demodulator stage 16 fed from the output of the downconverter stage 13. A microcontroller 17 controls the various functions of the tuner, including setting up the synthesiser to tune the local oscillator 15 to the requisite frequency for the selection of the RF channel of interest, and receiving an AFC (automatic frequency control) flag signal 18 from the PLL stage for purposes to be described later. Preceding the tuner 10 is a head unit 20 connected to a satellite dish 21 and containing a down-converter and low-noise amplifier stage 22, which feeds the RF input of the tuner 10.

The PLL block 16 contains a reference-signal generator in the form of a voltage-controlled oscillator (VCO) 23 which generates a signal whose frequency is compared with the incoming signal from the downconverter stage 13 in a phase comparator 24. Control of the VCO frequency is achieved by, for example, the use of a varactor diode 25, the capacitance of which is varied from the output of the phase comparator 24 by way of an amplifier 26. The varactor diode 25 is shunted by a reactance, in this case the inductor 27, for reasons to be explained shortly.

There are three centre-frequencies associated with the tuner 10. These are: the centre-frequency of the IF (intermediate frequency) following down-conversion in the down-converter stage 13, this centre-frequency being a function of the frequency accuracy of the head-unit down-conversion stage 22 and the frequency-accuracy of the local oscillator 15; the centre-frequency of the SAW filter 19 in the down-converter stage 13, and the centre-frequency of the VCO in the PLL stage 16. In the interest of providing optimum signal-to-noise ratio, it is desirable that all three of these coincide as far as possible. This is shown diagrammatically in FIG. 2 of the accompanying drawings, in which curve 30 represents the bandwidth of the SAW filter 19, curve 31 the frequency characteristic of the IF entering the SAW filter 19 and curve 32 is the controllable frequency range of the VCO in the PLL stage 16. In the ideal state, the centre of the VCO's frequency range, the centre of the IF and the centre of the SAW's response should coincide at 33.

In the known alignment procedure two alignment processes are carried out: one manual and mechanical and performed during alignment of the tuner in production, the other automatic and electronic and performed during normal operation of the tuner. The manual/mechanical alignment procedure generally consists in injecting a signal of a known carrier frequency into the tuner, allowing this signal to be downconverted to IF by the downconverter stage 13, then adjusting the physical dimensions of an air coil of the inductor 27 to centre the VCO output frequency onto the IF frequency. The alignment is monitored either by measuring the video output signal, or by sampling the AFC data generated by the PLL demodulator on line 18. In a typical set-up involving the first of these monitoring alternatives, a signal of, say, 1.5 GHz frequency is input into the AGC section 12 modulated with, say, a ±20 MHz ramp signal. Two signals will then be fed into the X- and Y-terminals of an oscilloscope: the ramp modulating signal into the X-terminals and the PLL-demodulated output signal ("Video Output") into the Y-terminals. The air core of the inductor 27 is then adjusted until the appropriate waveform is obtained on the screen, at which point the VCO is correctly aligned.

The automatic alignment involves the AFC function already mentioned. This function compares the centre-frequency of the VCO to the IF centre-frequency at the output of the SAW filter and, if the latter is higher than the former, the output on line 18 goes, say, logic low ("0"), whereas if the IF centre-frequency is lower than the VCO centre-frequency the AFC output on line 18 goes high ("1"). This is illustrated in FIG. 3 of the accompanying drawings, in which ΔF is the difference in the centre-frequencies. The logic signal on line 18 is used by the micro-controller 17 to adjust the frequency of the downconverter local oscillator 15 (via the synthesiser 14) in a direction such as to bring the two centre-frequencies into alignment.

Use of an AFC function in this way corrects for errors in the centre-frequency of the head unit 20 due mainly to the susceptibility of the unit to temperature fluctuations. These can be quite severe, since the unit is usually situated in the open air and may therefore be subject to extreme weather conditions.

The afore-mentioned inductor adjustment is a procedure which conventionally takes place on the bench in a production-line setting and is, by its very nature, quite cumbersome and expensive, since it requires either costly manual labour to perform it, as described above, or some kind of test machine. By way of example, if the alignment costs $40 per hour and three units are aligned per minute, then the alignment cost per unit is $0.22. This known alignment procedure is not just expensive, however, it is also far from perfect. This is because it does not compensate for drift in the frequencies of the local oscillators 15 and 23 which can arise due to ageing, temperature fluctuations (not so serious as in the head unit) or the use of a different tuner supply voltage form the voltage applied during adjustment of the inductor 27. Also, if the centre-frequency of the VCO 23, specifically, is in error, the AFC function will assume this is a head-unit error and so wilt "correct" for it by incorrectly aligning the tuner. The result, in an analogue TV system, is a compromised performance with visual impairments to the picture being apparent to the viewer.

There is therefore a need for an alignment arrangement which takes into account the effects of factors such as ageing and temperature and supply-voltage variations in the tuner and does so, ideally, in a more cost-effective manner than the known alignment arrangement. It would also be advantageous if such a new arrangement were to involve minimal redesign of the known arrangement, especially as far as hardware is concerned.

Basic Concept of the Invention

In accordance with the present invention, there is provided a tuner comprising an RF input stage, a downconverter stage fed from said RF input stage for providing an if signal, a phase-locked-loop demodulator stage fed from said downconverter stage and comprising a reference-signal generator, characterised in that said tuner comprises an alignment arrangement for use during an alignment phase of said tuner, said alignment arrangement comprising: means for injecting into said demodulator stage during said alignment phase an alignment signal having a frequency corresponding to a nominal value of a centre-frequency of said IF signal; means for adjusting the frequency of said reference signal until it is substantially aligned with the frequency of said alignment signal; and means for thereupon removing said alignment signal.

The reference-signal generator may be a voltage-controlled generator having a control input, and the means for adjusting the reference-signal frequency may comprise a variable voltage means connected to the control input. The variable voltage means may be a digital-to-analogue converter.

The tuner may comprise an automatic frequency-control (AFC) arrangement configured to maintain, during normal use of the tuner, substantial agreement between the IF centre-frequency and a centre-frequency of the reference-signal generator. The AFC arrangement may generate a flag signal for the indication of said agreement and the means for adjusting the frequency of the reference signal may make use of the flag signal to determine when the reference-signal frequency is substantially aligned with the alignment-signal frequency. The flag signal may derive information concerning said agreement from the demodulator stage.

The downconverter stage may comprise a local oscillator controlled from a frequency synthesiser, and the injecting means may comprise a prescaler output of the frequency synthesiser. Alternatively, the local oscillator may feed a divide-by-four stage which, in turn, supplies a change-over switch means, the output of which feeds the demodulator stage. The tuner may be arranged to control the local oscillator such that it feeds a signal at four times the nominal IF centre-frequency to the divide-by-four stage, and may activate the switch means such that an output of the divide-by-four stage is routed through to the demodulator stage during the alignment phase.

The tuner may comprise a means for disabling normal IF operation during the alignment phase.

In a second aspect of the invention, there is provided a method for correcting the frequency alignment of a reference-signal generator forming part of a phase-locked-loop demodulator stage in an analogue tuner, said tuner comprising an RF input stage and a downconverter stage fed from said RF input stage and connected to said demodulator stage for the feeding of an IF signal thereto, said method comprising the steps of, in an alignment phase: injecting into said demodulator stage an alignment signal having a frequency corresponding to a nominal value of a centre-frequency of said IF signal and adjusting the frequency of said reference signal until said alignment-signal frequency and said reference-signal frequency are in substantial alignment; then, to enable a normal operation of said tuner, removing said alignment signal.

BRIEF DESCRIPTION OF THE DRAWINGS

The invention will be further described, by way of example, with reference to the accompanying drawings, in which:

FIG. 2 is a diagram illustrating the desired relationship of an SAW filter bandwidth, an IF signal and a VCO range of the tuner of FIG. 1;

FIG. 3 is a diagram illustrating an AFC characteristic of the tuner of FIG. 1;

FIG. 4 is a block circuit diagram of a tuner constituting an embodiment of the invention; and FIG. 5 is a block circuit diagram illustrating a possible modification to part of the tuner of FIG. 4.

DESCRIPTION OF THE PREFERRED EMBODIMENTS

Figure 1:
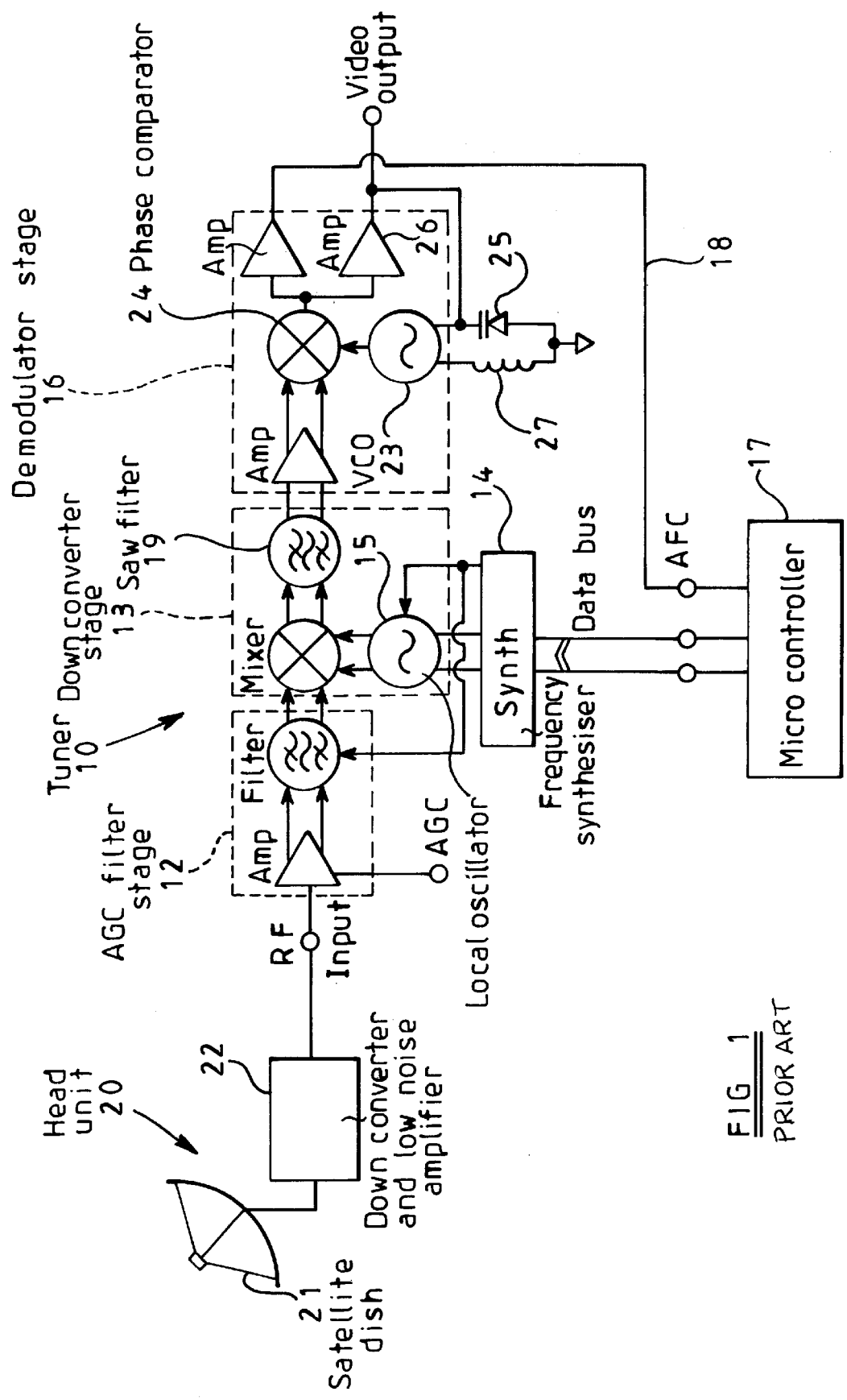
FIG. 1 is a block circuit diagram of a known tuner.

Like reference numerals refer to like parts throughout the drawings.

Referring now to FIG. 4, an embodiment of a tuner according to the invention is illustrated which contains the components present in the known arrangement of FIG. 1, but includes in addition a digital-to-analogue converter (DAC) 40, the output of which forms the ground return of the varactor 25 and inductor 27. The node connecting these three items is decoupled to actual ground by means of a decoupling capacitor 41. This DAC may, conveniently, be a spare device present in the microcontroller 17.

In one embodiment of an alignment operation according to the invention, the synthesiser 14 is programmed to provide a prescaler alignment signal of output frequency equal to the centre frequency of the SAW filter, i.e. in a typical application 479.5 MHz. The alignment signal is injected into the PLL-stage input amplifier 32 via a connection 33, which may take the form of a loosely directionally coupled stripline. During this time the normal IF signal is prevented from interfering with the alignment process. This can be done by, for example, disabling the downconverter mixing function 50 or disconnecting the output of the mixer 50 or the output of the SAW filter 19.

At this point the DAC 30 is arranged to be fed by a predetermined digital input signal, e.g. all zeroes. This would, for example, give rise to a maximum voltage across the varactor 25, so that the VCO 23 was oscillating at its maximum frequency. Assuming this meant that the VCO frequency was higher than the IF centre frequency at the output of the SAW filter, the AFC line 18 would be supplied with, say, a logic "1" from the PLL stage. Now the DAC input is incremented in steps of one bit, e.g. form 0000 to 0001 to 0010, etc, which has the effect of reducing the VCO frequency, moving it along the curve shown in FIG. 3, i.e. from point A to point B. When the two frequencies are aligned, the AFC voltage drops sharply to zero at point C, upon which the DAC input is held at its current setting and the tuner is switched out of its alignment mode, making sure at the same time that the hard-wired connection 33 from the synthesiser 14 to the PLL amplifier 32 does not load the latter during normal operating mode. In practice the loosely coupled stripline form of this connection can be arranged to go high-impedance at the end of the alignment operation, thereby presenting minimal loading to the IF signal path.

Finally, upon coming out of the VCO alignment phase the injection signal 33 is removed and the formal IF function re-enabled.

During normal operation of the tuner now, any subsequent drift in the centre-frequency of the VCO will give rise to a corresponding adjustment of the frequency of the local oscillator 15 in the downconverter by means of a change in logic level of the AFC flag line 18, this being part of the normal AFC action. This adjustment of the local oscillator 15 is undesirable, since it takes the IF centre-frequency away from its alignment with the centre-frequency of the SAW filter. In order to correct for this error, the VCO centre-frequency is re-aligned on a regular basis in the same manner as the alignment already described. These re-alignment steps are carried out through suitable additional content to the software controlling the microcontroller.

Looking at the re-alignment aspect of the invention in more detail, if it is assumed, as has already been described, that the frequency of the VCO 23 started high during the initial alignment process and was brought into agreement with the injection frequency by adjustment of the DAC, so that the AFC flag received a logic "0", then during the subsequent re-alignment process, regardless of how the flag had behaved during the normal operating mode of the tuner, if the VCO frequency had dropped relative to its final value at the end of the initial alignment phase, the AFC flag would be "0" once again and would signal the DAC control input to be adjusted from its final value at the end of the initial alignment phase to a series of values in the opposite direction (i.e. towards all-zeroes). This adjustment of the DAC would continue until the flag went to "1", signalling that the VCO frequency was again in alignment with the injection frequency. The DAC setting would then again be frozen until the next re-alignment phase.

If, at the start of the re-alignment phase just described, the VCO frequency had risen over time, the AFC flag would assume a value of "1", which would signal to the microcontroller to change the DAC control-input value in the same direction as in the initial alignment phase, i.e. towards all-ones. This would continue until the flag assumed a "0" value, whereupon the DAC setting would stay at its last value until the next re-alignment phase was entered.

This arrangement has the advantage that alignment of the tuner can be automatic, being electronic and controlled by software, so that no labour costs are involved in the alignment process, and can be carried out at regular intervals, e.g. each time the channel setting is changed. Alternatively (or even additionally) re-alignment may be performed on a more regular, periodic basis (e.g. once every hour).

Changes can be made to the illustrated embodiment without altering the functioning of the alignment arrangement. Thus, for example, the DAC may be present in the synthesiser instead of in the microprocessor and the injection source (here given as 479.5 MHz) may be obtained from somewhere else in the tuner instead of from the synthesiser, though the latter is a convenient and accurate source. Also, the injection signal may be injected into any point of the IF signal path, e.g. just before the SAW filter.

One alternative way of deriving the injection signal is to arrange for the local oscillator 15 in the downconverter block 13 to feed a buffered ÷4 block 51, the output of which is taken to one input of a switch 52. The other input of the switch 52 is fed from the output of the mixer 50. The output of the switch 52 then drives the SAW filter 19. (See FIG. 5).

In this alternative injection method, in the VCO-alignment mode the switch 52 is changed over to pass on the ÷4 signal to the input of the SAW filter and hence the PLL block 16, while the synthesiser 14 is commanded to tune the downconverter local oscillator 15 to 4×479.5 MHz. The result is a 479.5 MHZ signal entering the PLL, as before. This embodiment automatically effects an isolation of the mixer output of the downconverter stage 13, mentioned in connection with the first embodiment as one possible way of removing the influence of the normal RF/IF signal during alignment. However, the embodiment has the additional complexity that it requires that the normal AFC action on the local oscillator 15 be disabled during the alignment phase.

While the embodiments described have related to a satellite receiver, they are also applicable to any similar kind of tuner architecture. Also, it is possible to implement the inventive alignment method within the framework of a static alignment procedure, i.e. arrange for the DAC settings to be adjusted on a one off basis on, for example, the production bench, similar to the known mechanical alignment procedure described earlier.

Although its has so far been assumed that it is necessary to remove the influence of the normal RF/IF signal during the alignment phase, this may not be necessary in situations in which the signal from the RF stage 12 is weak at the time of alignment.

What is claimed is:

1. A tuner comprising: an RF input stage; a downconverter stage fed from said RF imput stage for providing an IF signal; a phase-locked-loop demodulator stage fed from said downconverter stage and comprising a reference-signal generator for generating a reference signal, and an alignment arrangement for use during an alignment phase of said tuner, said alignment arrangement comprising: means for injecting into said demodulator stage during said alignment phase an alignment signal having a frequency corresponding to a nominal value of a centre-frequency of said IF signal; means for adjusting a frequency of said reference signal until said frequency of said reference signal is substantially aligned with said frequency of said alignment signal, and means for thereupon removing said alignment signal.

2. A tuner as claimed in claim 1, wherein said reference-signal generator is a voltage-controlled generator having a control input and said means for adjusting said reference-signal frequency comprises a variable voltage means connected to said control input.

3. A tuner as claimed in claim 2, wherein said variable voltage means is a digital-to-analogue converter.

4. A tuner as claimed in claim 1, wherein said tuner comprises an automatic frequency-control arrangement configured to maintain, during normal use of said tuner, a substantial agreement between said IF centre-frequency and a centre-frequency of said reference-signal generator, said automatic frequency-control arrangement comprising a flag-signal means for the indication of said agreement, said means for adjusting said frequency of said reference signal being associated with said flag-signal means thereby to determine when said reference-signal frequency is substantially aligned with said alignment-signal frequency.

5. A tuner as claimed in claim 4, wherein said flag-signal means derives information concerning said agreement from said demodulator stage.

6. A tuner as claimed in claim 1, wherein said downconverter stage comprises a local oscillator and a frequency synthesiser for controlling said local oscillator and wherein said injecting means comprises a prescaler output of said frequency synthesiser.

7. A tuner as claimed in claim 1, wherein said downconverter stage comprises a local oscillator having an output, said injecting means comprises a divide-by-four stage having an output and fed from said output of said local oscillator and a change-over switch fed from said output of said divide-by-four stage and feeding said demodulator stage, and said tuner comprises means for controlling said local oscillator to supply a signal at four times said nominal IF centre-frequency to said divide-by-four stage and means for activating said switch means to connect said output of said divide-by-four stage to said demodulator stage during said alignment phase.

8. A tuner as claimed in claim 1, comprising means for disabling a normal operation during said alignment phase.

9. A method of correcting a frequency alignment of a reference-signal generator forming part of a phase-lockedloop demodulator stage in an analogue tuner, said tuner comprising an RF input stage and a downconverter stage fed from said RF input stage and connected to said demodulator stage for the feeding of an IF signal thereto, said method comprising the steps of, in an alignment phase: injecting into said demodulator stage an alignment signal having a frequency corresponding to a nominal value of a centre-frequency of said IF signal; adjusting said frequency of said reference signal until said alignment-signal frequency and said reference signal frequency are in substantial alignment; and removing said alignment signal to enable a normal operation of said tuner.

10. A method as claimed in claim 9, wherein said step of adjusting said reference-signal frequency comprises varying a control signal driving a digital-to-analogue converter connected to a control input of said reference-signal generator.

11. A method as claimed in claim 9, wherein said tuner comprises an automatic frequency-control arrangement configured to maintain, during said normal operation of said tuner, substantial agreement between a centre-frequency of said reference signal and said IF centre-frequency, said method comprising indicating said substantial alignment by means of a flag signal provided by said demodulator stage, said flag signal being used as part of an automatic frequency-control function during said normal operation of said tuner.

12. A method as claimed in claim 9, wherein said alignment signal is injected into said demodulator stage from a frequency synthesiser, said synthesiser controlling, during said normal tuner operation, a local oscillator of said downconverter stage.

13. A method as claimed in claim 9, wherein said downconverter stage comprises a local oscillator which is arranged to oscillate at four times said nominal IF frequency thereby to provide said alignment signal, said alignment-signal frequency being divided by four before being injected into said demodulator stage.

14. A method as claimed in claim 9, comprising an initial step of disabling a normal IF operation at the start of said alignment phase.

* * * * *